United States Patent
McDaniel

(10) Patent No.: US 12,385,129 B2
(45) Date of Patent: Aug. 12, 2025

(54) GRAPHENE VAPOR DEPOSITION SYSTEM AND PROCESS

(71) Applicant: Richard Tracy McDaniel, Wright City, MO (US)

(72) Inventor: Richard Tracy McDaniel, Wright City, MO (US)

( * ) Notice: Subject to any disclaimer, the term of this patent is extended or adjusted under 35 U.S.C. 154(b) by 132 days.

(21) Appl. No.: 18/187,908

(22) Filed: Mar. 22, 2023

(65) Prior Publication Data

US 2023/0416908 A1 Dec. 28, 2023

Related U.S. Application Data

(60) Provisional application No. 63/366,776, filed on Jun. 22, 2022.

(51) Int. Cl.
*C23C 16/26* (2006.01)
*C23C 16/01* (2006.01)
*C23C 16/02* (2006.01)

(52) U.S. Cl.
CPC ............. *C23C 16/26* (2013.01); *C23C 16/01* (2013.01); *C23C 16/0209* (2013.01)

(58) Field of Classification Search
CPC ..... C23C 16/26; C23C 16/01; C23C 16/0209; C23C 14/0605; C23C 14/025; C23C 14/243; C23C 14/5873
See application file for complete search history.

(56) References Cited

U.S. PATENT DOCUMENTS

| | | | |
|---|---|---|---|
| 8,613,811 B2 | 12/2013 | Fujita et al. | |
| 8,772,181 B2 | 7/2014 | Noda et al. | |
| 8,835,286 B2 | 9/2014 | Hiura et al. | |
| 8,865,105 B2 | 10/2014 | Tzeng | |
| 8,878,157 B2 | 11/2014 | Wu et al. | |
| 8,932,904 B2 | 1/2015 | Kondo et al. | |
| 9,067,796 B2 | 6/2015 | Strupinski | |
| 9,112,002 B2 | 8/2015 | Sullivan-Malervy et al. | |
| 9,233,851 B2 | 1/2016 | Jeon et al. | |
| 9,255,007 B2 | 2/2016 | Chiba et al. | |
| 9,371,234 B2 | 6/2016 | Hong et al. | |
| 9,580,323 B2 | 2/2017 | Mukasyan et al. | |
| 9,796,592 B2 | 10/2017 | Xu | |
| 9,822,009 B2 | 11/2017 | Kagaya et al. | |
| 10,246,795 B2 | 4/2019 | Yoon et al. | |
| 10,396,160 B2 | 8/2019 | Lai et al. | |
| 10,580,591 B2 | 3/2020 | Wang et al. | |

(Continued)

FOREIGN PATENT DOCUMENTS

WO WO-2017027908 A1 * 2/2017 ........... C01B 32/186

OTHER PUBLICATIONS

WO 2006/073012 machine translation (Year: 2006).*

*Primary Examiner* — Michael P Wieczorek
(74) *Attorney, Agent, or Firm* — Dunlap Bennett & Ludwig, PLLC; Anna L. Kinney

(57) ABSTRACT

A graphene vapor deposition system and process are disclosed. The system includes a support for a copper-plated sheet, a housing defining an interior region, a hydraulic cylinder to move the housing between a first and a second position, a pump to evacuate the interior region, carbon powder within the interior region, and a heat source to vaporize the carbon powder, for causing graphene vapor deposition on the copper. The process includes dissolving the copper and recovering the graphene.

12 Claims, 4 Drawing Sheets

(56) References Cited

U.S. PATENT DOCUMENTS

| | | |
|---|---|---|
| 10,865,488 B2 | 12/2020 | Fray et al. |
| 10,886,126 B2 | 1/2021 | Zhong et al. |
| 10,920,314 B2 | 2/2021 | Shivareddy et al. |
| 11,000,963 B2 | 5/2021 | Mavroeidis et al. |
| 11,332,830 B2 | 5/2022 | Lin et al. |
| 11,518,056 B2 | 12/2022 | Mavroeidis et al. |
| 2013/0011574 A1 | 1/2013 | Kobayashi et al. |
| 2015/0140211 A1* | 5/2015 | Strobl .................. C23C 16/4404 118/725 |
| 2015/0158729 A1 | 6/2015 | Wu et al. |
| 2016/0280551 A1 | 9/2016 | Hasegawa et al. |
| 2018/0057933 A1 | 3/2018 | Ifuku et al. |
| 2019/0003042 A1* | 1/2019 | Seo ..................... C23C 16/4485 |
| 2019/0300372 A1 | 10/2019 | Lin et al. |
| 2019/0312261 A1 | 10/2019 | He et al. |

\* cited by examiner

GRAPHENE VAPOR DEPOSITION SYSTEM AND PROCESS

REFERENCE TO RELATED APPLICATION

This nonprovisional application is based upon U.S. provisional application Ser. No. 63/366,776 filed Jun. 22, 2022, incorporated by reference in its entirety.

FIELD

The present subject matter, in general, relates to graphene production and, more particularly, relates to a graphene vapor deposition system and process.

BACKGROUND

Graphene refers to a two-dimensional material having a beehive-like lattice arrangement formed by carbon hybrid orbitals. Graphene is optically transparent and has extraordinarily high thermal conductivity and electron mobility properties at room temperature (i.e., from about 68 to 72 degrees Fahrenheit) as well as atomic levels of low thickness and high mechanical strength. These exceptional properties have provided graphene with unique, extensive industrial applicability in the functioning of products including photonic and electronic parts, fuel cells, electrochemical products, sensory devices, field emission, hydrogen storage, and power-supplying materials.

Currently known methods of producing graphene include, for example, the following: (1) in a separation method, individual graphene plates are separated from a graphite crystal by mechanical or chemical means and their combination; and the size of assorted graphene plates synthesized from this method generally tend to be smaller than a graphite crystal; therefore, they are not suitable for use in large-area applications; (2) in another method, silicon carbide is heated to a high temperature to remove silicon, which results in single-layer or multilayer graphene; however, graphene made by this method cannot be adapted for uses on non-silicon carbide substances; moreover, it can cause problems when required to produce large area graphene sheets of uniform thickness; (3) chemical vapor deposition is currently the most popular, known preparation method for making graphene; yet, an inclination to produce monolayer and multilayer polycrystalline graphene having island-like, small crystalline domains and grain boundaries, make it difficult to achieve flat mono layer graphene having large crystalline domains, or large area monolayer graphene sheet.

As there currently is no known way to produce flat, mono layer graphene having large crystalline domains, or large area monolayer graphene sheets, it can be appreciated that a process for producing flat, mono layer graphene having large crystalline domains or large area monolayer graphene sheets efficiently, is desirable.

SUMMARY

The present subject matter is directed to a graphene vapor deposition system and process. A process for producing graphene according to an embodiment of the present subject matter may include the following steps. A sheet of metal could be electroplated with copper. Such a sheet of metal would be selected to not dissolve in an acidic solution (e.g., nitric acid or sulfuric acid in which copper dissolves), for producing sheets of graphene. The copper-plated sheet when transferred to a table, conveyor belt, or transfer medium, can be aligned with hydraulic cylinders supported above, which can be activated for moving a vacuum assembly down onto a copper-plated sheet on the transfer belt, table, or conveyor. At least one tray may contain carbon powder within the vacuum assembly. Vacuum may be initiated, and a primary heat source activated to heat the interior of a vacuum assembly. Once vacuum is achieved, a secondary heat source may be activated to vaporize carbon by raising the temperature to at least the carbon vaporization temperature. Vaporized carbon next attaches to the copper plate via vapor deposition, thereby producing graphene. After a desired amount of graphene forms on a treated region of plate, a vacuum release valve releases vacuum, and the vacuum assembly is raised. The conveyor belt or table can move a plate to different positions, for desired graphene build-up. The plate can be moved to overlapping positions to fill gaps left by a first graphene application. Vacuum can be released again, the vacuum assembly raised, and the copper plated sheet transferred to a copper dissolving solution tank. Graphene can be separated from plates and stored. Process steps could be repeated, as needed.

BRIEF DESCRIPTION OF THE DRAWING FIGURES

FIG. 1 presents an exploded view of the components of a system and process for producing graphene according to principles of the present subject matter.

DETAILED DESCRIPTION

Graphene produced by a system or apparatus according to embodiments of the present subject matter could be produced using subtractive manufacturing techniques. For instance, graphene produced by a system or apparatus according to embodiments of the present subject matter could be formed to a predetermined shape or size to optimize efficiency. The graphene could next be laser cut, to size. Hydraulics, lasers, heat sources, carbon, vacuum pumps, and conveyors may be purchased from commercial sources. To create a vacuum seal, please refer to "How to make a vacuum seal" on YouTube. Suitable vacuum seals must be heat resistant.

Graphene vapor deposited onto copper-plated sheet is separated from the copper-plated sheet by dissolving copper on which the graphene was deposited.

In some embodiments, mobile robotic arms on guide tracks may be used to transfer plates through the production process. A mobile plating tank and a mobile plate stacking table, a mobile dissolving fluid tank and a mobile vacuum plate holder table may be automated, computer controlled, and chain driven. For example, a large robotic arm may be used to transfer a plate into an automated electro-plating tank under a vacuum housing and to transfer it to a vacuum press table (or vice versa). Carbon may form on the plate on the vacuum table. The large robotic arm may transfer the carbonized plate onto a dissolving tank to remove carbon. the dissolving tank may be fitted with anti-sloshing guards. The large robotic arm may stack clean vacuum plates onto a plate holding table and may place the clean vacuum plates onto the electro-plating tank. Once the plate holding table is full, it may move autonomously or manually to a position in which the robotic arm can transfer plates from the stacking table to the electroplating tank. The electro-plating tank may be mounting on a mobile table that may move into line for plating and may move out of the way for a subsequent plating tank to move into position. In some cases, dozens of automated plating tanks may take turns moving into position. Small robotic arms may be used to place carbon and/or radioactive blocks (e.g., nuclear batteries) onto a carbon holder.

Figure 1:
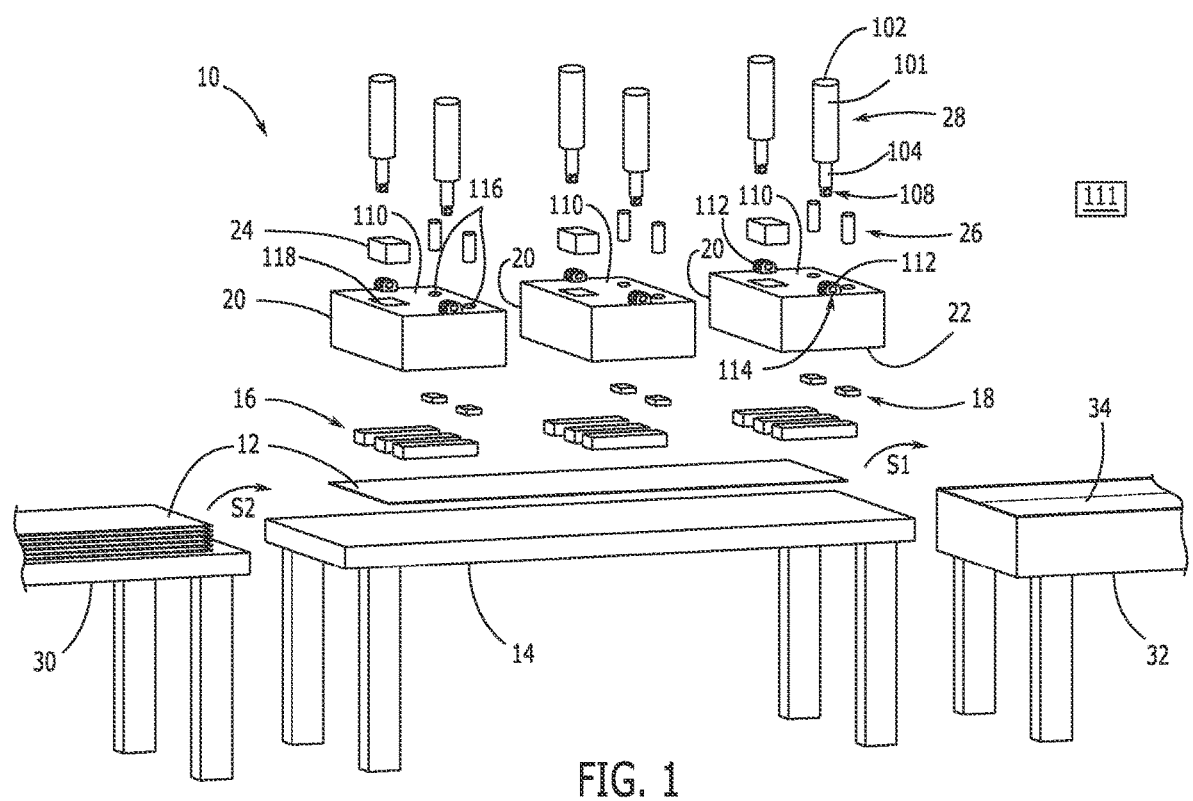

Referring initially to FIG. 1 a graphene production system 10 according to an embodiment of the present subject matter includes a press frame (not shown) and an elongated table 14. The system 10 also includes an elongated copper-plated sheet of metal 12 disposed longitudinally atop the table 14. The system 10 further includes a plurality of vacuum housings 20 disposed above the copper-plated sheet of metal 12. The system 10 includes an associated plurality of hydraulic cylinders 28. Two of the plural hydraulic cylinders 28 are associated with each one of the plural vacuum housings 20. Each of the plural hydraulic cylinders 28 has a main body portion 101, a first end portion 102 secured to the press frame, and a second end portion 104 opposite the first end portion 102. The second end portion 104 of each of the plural hydraulic cylinders 28 is extendable from and retractable into the main body portion 101. A distal end of the second end portion 104 of each of the plural hydraulic cylinders 28 defines a through bore 108 disposed transverse to the direction of extension-and-retraction of the second end portion 104. An upper surface 110 of each of the plural vacuum housings 20 includes a spaced-apart pair of mounts 112 unitary with the upper surface 110. Each of the two mounts 112 of each of the plural vacuum housings 20 defines a through bore 114 oriented to align with the through bore 108 of the second end portion 104 of an associated hydraulic cylinder 28, so that a pin (not shown) is passed though the bores 108 and 114 for securing a spaced-apart pair of hydraulic cylinders 28 to each vacuum housing 20.

The system 10 includes a plurality of primary heating sources 16 and a plurality of carbon trays 18 disposed between the elongated copper-plated sheet of metal 12 and the plurality of vacuum housings 20. Three of the plural primary heating sources 16 and two of the plural carbon trays 18 are disposed beneath each one of the plural vacuum housings 20. The system 10 also includes a plurality of vacuum pumps 24 and a plurality of secondary heating sources 26 disposed between the plurality of vacuum housings 20 and the plurality of hydraulic cylinders 28. The upper surface 110 of each vacuum housing 20 defines a spaced apart pair of through bores 116 sized and configured to receive an end portion of each one of the spaced-apart pair of secondary heating sources 26 through the upper surface 110 (FIG. 3) of each associated one of the plural vacuum housings 20. The upper surface 110 of each one of the plural vacuum housings 20 defines a recess 118 which is dimensioned and configured to receive a lower end portion of one of the plural vacuum pumps 24.

Figure 2:
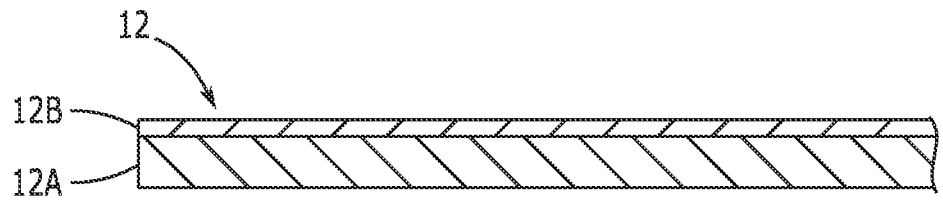
FIG. 2 is a cross-sectional, side elevational view of a graphene-producing plated feature of the present subject matter, on an enlarged scale relative to FIG. 3.

Referring next to FIGS. 1-4, additional features and advantages of the present subject matter shall now be described in detail. The elongated copper-plated sheet of metal 12 (FIG. 2) includes an upper layer 12B of a metal such as copper that will dissolve in an acid such as nitric acid or sulfuric acid and a lower layer 12A of a metal that will not dissolve in an acid such as nitric acid or sulfuric acid. For instance, while most metals dissolve in nitric acid (HNO3), the following precious metals: gold (Au), platinum (Pt), and palladium (Pd) do not dissolve even in concentrated HNO3. Moreover, certain other non-precious metals, namely, iron (Fe), nickel (Ni), chromium (Cr), and aluminum (Al) do not dissolve in HNO3 because of the formation of an oxide layer on the surface of these metals, which prevents further reaction with HNO3. To manufacture an elongated copper-plated sheet of metal 12 (FIG. 2), the upper may be 12B could be electroplated onto the lower layer 12A. Each vacuum housing 20 defines an interior region 120 (FIG. 3) and includes a vacuum seal 22 (FIGS. 1, 3) along an underside surface. When operative, the second end portion 104 of each of the plural hydraulic cylinders 28 (FIG. 1) is connected to an associated mount 112 (unitary with the upper surface 110) of a vacuum housing 20; and each pair of hydraulic cylinders 28 is actuated, to extend the spaced-apart pair of extendable second end portions 104, to move the associated vacuum housing 20 downward to provide a vacuum seal at an upper surface of upper layer 12B (FIG. 2).

Figure 3:
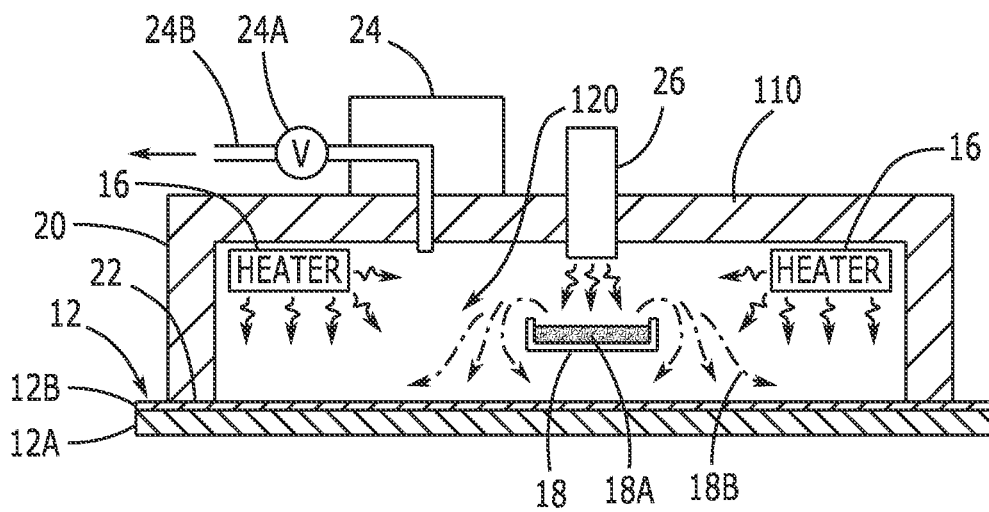
FIG. 3 is a side elevational view, partially in section, of the system and process for producing graphene according to principles of the present subject matter.
Figure 4:
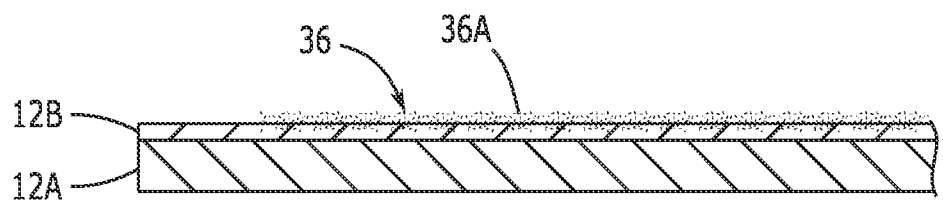
FIG. 4 is a cross-sectional, side elevational view of a feature of the present subject matter shown in FIG. 2, with graphene particles now formed thereon.

Before initiating graphene production, the plural carbon trays 18 (FIG. 1) are arranged above the copper-plated sheet of metal 12 a predetermined distance by means (not shown); and each tray 18 is provided a block 18A of carbon powder, as shown in FIG. 3. (Only one tray 18 is shown.) For operational purposes, each of the vacuum pumps 24 includes an evacuation line 24B (FIG. 3) used to evacuate the interior region 120 of an associated vacuum housing 20; and each evacuation line 24B includes a common "open/close" valve 24A to be used as needed. When the interior region 120 of an associated vacuum housing 20 is sufficiently evacuated, the primary heaters 16 (only two are shown in FIG. 3) and the secondary heaters 26 (only one is shown) are used to heat the block 18A of carbon powder, converting carbon powder to vaporized carbon 18B (FIG. 3), which initially forms graphene deposits 36A (FIG. 4) on the upper layer 12B of the copper-plated sheet of metal 12. The primary heaters 16 and the secondary heaters 26 are each powered by a source (not shown). During operation of the system 10 (FIG. 1), the graphene deposits 36A ultimately form a graphene layer 36 on the upper layer 12B of the sheet of metal 12.

Figure 5:
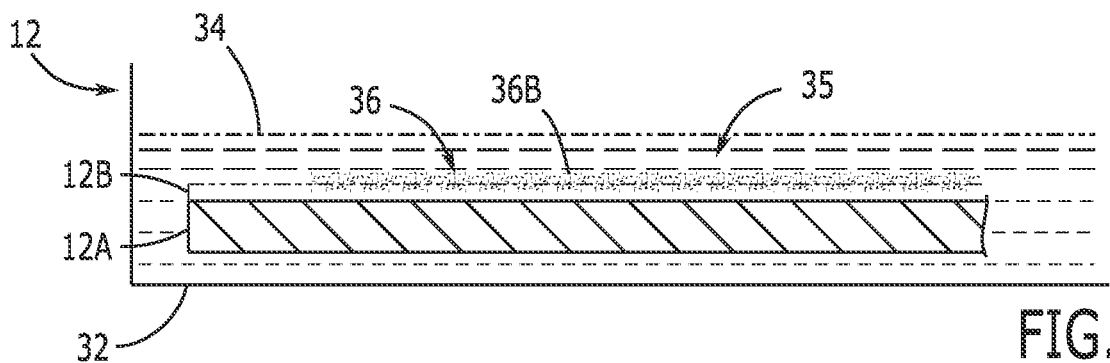
FIG. 5 is another cross-sectional, side elevational view of the subject matter shown in FIG. 4, after its transfer into a metal (e.g., copper) dissolving tank.

Referring next to FIGS. 1 and 5, additional features and advantages of the present subject matter shall now be described in detail. After a graphene layer 36 has formed to predetermined thickness on the upper layer 12B of a sheet of metal 12, the graphene layered sheet of metal 12 is transferred into a copper dissolving tank 32, noted by step 1 ("S1") in FIG. 1; another elongated copper-plated sheet of metal 12 is moved from a plate loading station 30 placed atop vacuum table 14, noted by step 2 ("S2"); and the process described, for forming a layer of graphene on the fresh sheet of metal 12, is repeated.

After the graphene layered sheet of metal 12 has been transferred into the copper dissolving tank 32 and spaced above the (inner) bottom of the tank 32 by means (not shown), the copper dissolving tank 32 is filled initially with an acidic liquid substance, e.g., nitric acid or sulfuric acid to an upper level 35. After the layer of copper 12B has been dissolved by the acidic liquid, an upper level 34 of the liquid in the tank 32 may have a turquoise color typical for a copper-ion containing solution.

In FIG. 5, differences between levels 34, 35 are illustrative (not to scale). After the copper layer 12B has been totally dissolved by the acid liquid, a sheet of graphene 36B (FIG. 5) is available. Commercial-quality, industrial-grade sheets of graphene 36B produced by the system and process of the present subject matter are generally able to be rolled up and stored until needed or shipped to customers.

The system 10 includes an operational control system 111 operatively connected to the various components of system 10 described, for enabling efficient and effective control of the system 10, for producing graphene as described above.

Figure 6:
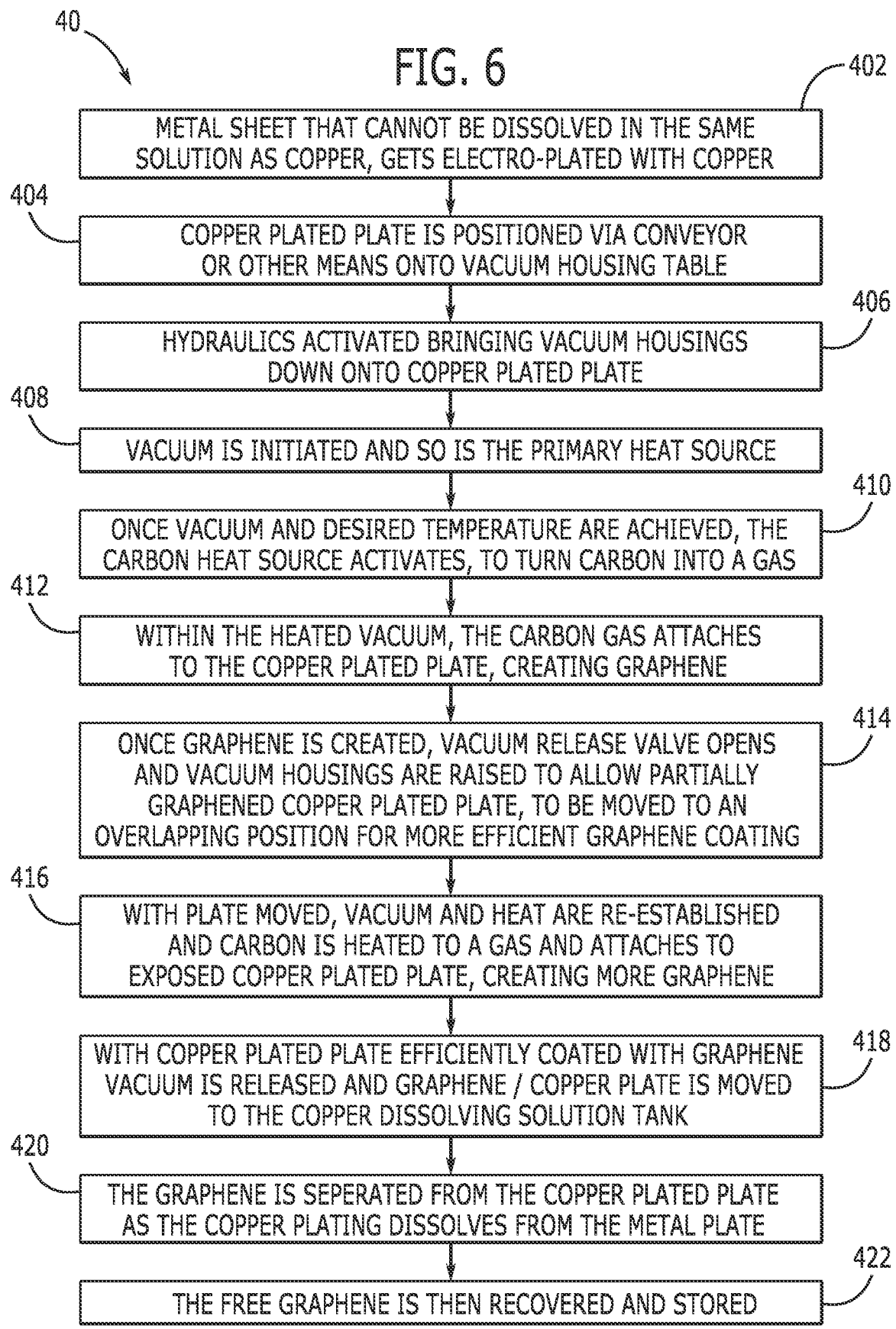
FIG. 6 is a diagram of an illustrative process presenting exemplary steps for producing graphene in accordance with principles of the present subject matter.

FIG. 6 presents a flowchart 40 (now described in detail) that is illustrative of a graphene vapor deposition process of the present subject matter. At step 402, a metal sheet, not dissolvable in a solution that dissolves copper, is electroplated with elemental copper. At step 404, a copper-plated sheet of metal is positioned, e.g., by conveyor or other means, onto a table or other surface upon which at least one vacuum housing is placed. At step 406, hydraulic cylinders are actuated to cause a vacuum housing to be lowered onto the table or other surface. At step 408, vacuum within the housing is initiated and a primary heat source is powered on. At step 410, once predetermined vacuum conditions and a desired temperature are achieved, a secondary heat source activates to vaporize the carbon. At step 412, the vaporized carbon attaches and condenses on the surface of the copper to produce graphene.

At step 414, once graphene has been created, a vacuum release valve is opened and the associated vacuum housing moved a predetermined distance from a first position to a second or so-called "overlapping" position, for achieving more efficient graphene coverage on the copper portion of a copper-plated sheet of metal. At step 416, after the copper-plated sheet of metal has been moved, predetermined vacuum conditions and the desired temperature are re-established, for producing graphene coverage at overlapping positions. At step 418, after the copper-plated sheet of metal has efficiently been coated with a layer or sheet of graphene, the vacuum and temperature conditions end; and a copper-plated sheet of metal with a layer or sheet of graphene thereon, is transferred to a copper-dissolving tank. At step 420, as copper dissolves in the tank, graphene is separated from the sheet of metal. At step 422, the now free graphene sheet or layer is thereafter recovered and stored.

Figure 7:
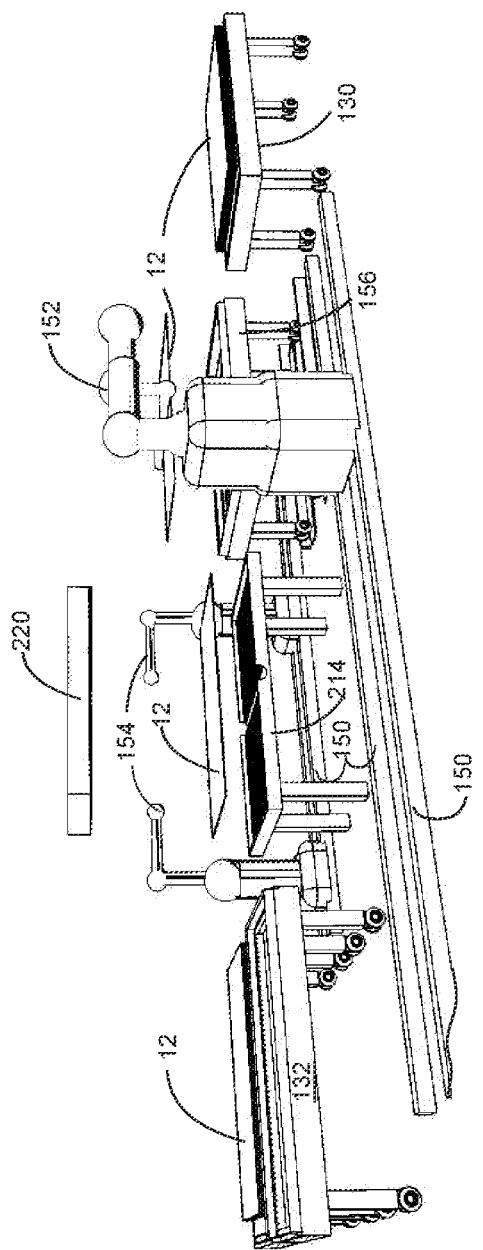
FIG. 7 is an exploded view of the components of a graphene production system according to another embodiment of the present invention.

FIG. 7 illustrates an alternate embodiment of the apparatus. A large robotic arm 152 on guide tracks 150 transfers a plate 12 into an automated electro-plating tank 156 and transfer it to a vacuum press table 214 under a vacuum housing 220. The large robotic arm 152 transfers the carbonized plate 12 onto a dissolving tank 132. The plate holding table 130 moves to a position in which the robotic arm 152 can transfer plates 12 to the electroplating tank 156. The electroplating tank 156 is also mobile to move into line for plating and to move out of the way for a subsequent plating tank to move into position. Small robotic arms place carbon 18A and/or radioactive blocks 16 (e.g., nuclear batteries) onto a carbon holder 18; see FIG. 1.

What has been illustrated and described in this patent application is a graphene vapor deposition system and process. While the present subject matter has been described with reference to exemplary embodiments, the present subject matter is not limited to these examples. On the contrary, many alternatives, changes, and/or modifications will become apparent to a person of ordinary skill in the art ("POSITA") after this application and its associated figures have been reviewed. Therefore, alternatives, changes, or modifications are to be treated as part of the present subject matter insofar as they fall within the spirit and scope of the claims.

What is claimed is:

1. A graphene vapor deposition system (10) comprising:
an electroplating tank (156);
a supporting surface (14) for supporting a copper-plated sheet of metal (12) adjacent to the electroplating tank (156);
at least one housing (20) defining an interior region (120), wherein the at least one housing (20) includes a sealing surface (22) that is capable when urged against the supporting surface (14) of maintaining predetermined vacuum conditions within the interior region (120) of the at least one housing (20);
a hydraulic cylinder means (28) operatively coupled to the at least one housing (20) for moving the at least one housing (20) between a first position above the supporting surface (14) and a second position to urge the sealing surface against the supporting surface and provide a vacuum-tight seal therebetween;
a pump (24) to evacuate the interior region (120) to the predetermined vacuum conditions when the sealing surface is urged against the supporting surface;
a predetermined amount of carbon disposed in the interior region;
a primary heating means (16) powered by a source to heat the interior region (120);
a secondary heating means (26) powered by the source to convert the carbon to vaporized carbon, for enabling graphene vapor deposition on the copper; and
a dissolving tank (132) adjacent to the housing (20).

2. The graphene vapor deposition system (10) of claim 1, including a control system (111) operatively connected to the pump (24) and the primary heating means, for controllably enabling graphene vapor deposition on the copper.

3. The graphene vapor deposition system (10) of claim 1, wherein at least one of the dissolving tank (132) and the electroplating tank (156) are mobile, and further comprising a mobile plate holding table (130) operative to move the copper-plated sheet (12) from a first plate position to a second plate position.

4. The graphene vapor deposition system (10) of claim 3, further comprising a mobile robotic arm (152) operative to transfer a metal sheet (12) to and from the supporting surface (214).

5. The graphene vapor deposition system (10) of claim 4, wherein the mobile robotic arm (152) is operative to transfer a sheet of metal (12A) into the electroplating tank (156), to transfer the copper-plated sheet (12) to the supporting surface (14), and to transfer the copper-plated sheet (12) into the dissolving tank (132).

6. The graphene vapor deposition system (10) of claim 3, wherein the dissolving tank (132), the electroplating tank (156), and the mobile plate holding table (130) are automated, computer-controlled, and chain driven.

7. The graphene vapor deposition system (10) of claim 1, wherein the at least one housing (20) comprises at least two housings (20).

8. A graphene vapor deposition process comprising:
transferring a sheet of metal into an electro-plating tank;
electro-plating the sheet to make a copper-plated sheet;
positioning the copper-plated sheet on a surface;

actuating hydraulic cylinder means to cause a vacuum housing defining an interior region to be lowered onto the surface, wherein the copper-plated sheet is disposed within the interior region;

initiating vacuum conditions within the interior region of the vacuum housing;

powering on a primary heating source within the interior region;

once predetermined vacuum conditions and a predetermined temperature by the primary heating source are achieved, activating a secondary heating source to vaporize carbon; and once the vaporized carbon has coated the copper-plated sheet to form a graphene coated copper-plated sheet, transferring the graphene coated copper-plated sheet into a dissolving tank filled with a copper-dissolving liquid.

9. The graphene vapor deposition process of claim 8, further including:

once graphene begins to form on the copper of the copper-plated sheet and before transferring the graphene coated copper-plated sheet into the dissolving tank, opening a vacuum release valve and moving the vacuum housing from a first position to a second position, and repeating the steps of actuating, initiating, powering on, and activating, to achieve more efficient graphene coverage on the copper.

10. The graphene vapor deposition process of claim 8, further including:

once the copper has dissolved, removing the graphene from the dissolving tank.

11. The graphene vapor deposition process of claim 10, further including:

after removing the graphene from the dissolving tank, storing the removed graphene.

12. The graphene vapor deposition process of claim 8, further comprising:

once graphene begins to form on the copper of the copper-plated sheet and before transferring the graphene coated copper-plated sheet into the dissolving tank, opening a vacuum release valve, raising the vacuum housing, and moving the copper-plated sheet from a first plate position to a second plate position, and repeating the steps of actuating, initiating, powering on, and activating, to achieve more efficient graphene coverage on the copper.

* * * * *